United States Patent
Lellis Junior et al.

(10) Patent No.: US 11,362,622 B2
(45) Date of Patent: Jun. 14, 2022

(54) SMART SELF-FEEDING FUSE WITH CURRENT DETECTION AND COMMUNICATION

(71) Applicant: ENERGISA S.A., Minas Gerais (BR)

(72) Inventors: Celso Garcia Lellis Junior, Santana de Parnaíba (BR); Ayres Antonio de Paes de Oliveira, Santana de Parnaíba (BR)

(73) Assignee: ENERGISA S.A., Minas Gerais (BR)

( * ) Notice: Subject to any disclaimer, the term of this patent is extended or adjusted under 35 U.S.C. 154(b) by 406 days.

(21) Appl. No.: 16/599,804

(22) Filed: Oct. 11, 2019

(65) Prior Publication Data

US 2021/0111671 A1   Apr. 15, 2021

(51) Int. Cl.
*H01H 85/042*   (2006.01)
*H02S 40/38*   (2014.01)
*H01H 85/02*   (2006.01)

(52) U.S. Cl.
CPC ......... *H02S 40/38* (2014.12); *H01H 85/0241* (2013.01); *H01H 85/042* (2013.01)

(58) Field of Classification Search
CPC .. H01H 85/0241; H01H 85/042; H01H 85/20; H02H 3/042; H02H 7/263; H02S 40/38
See application file for complete search history.

(56) References Cited

U.S. PATENT DOCUMENTS

| | | | | |
|---|---|---|---|---|
| 5,912,604 A * | 6/1999 | Harvey | .............. | H01H 33/6662 335/9 |
| 10,424,909 B2 * | 9/2019 | Stoupis | ................ | H02H 1/0084 |
| 2003/0212473 A1 * | 11/2003 | Vandevanter | ..... | H02J 13/00001 700/293 |
| 2004/0135676 A1 * | 7/2004 | Berkman | ................. | H04B 3/54 370/464 |
| 2005/0024218 A1 * | 2/2005 | Cuk | ........................ | H01H 85/30 340/638 |
| 2005/0169056 A1 * | 8/2005 | Berkman | ................. | H04B 3/58 365/185.22 |
| 2006/0197383 A1 * | 9/2006 | Frey | ................... | H01H 71/1081 307/64 |
| 2007/0226290 A1 * | 9/2007 | Khorramshahi | ........ | H04L 67/10 709/201 |
| 2008/0031520 A1 * | 2/2008 | Hou | ...................... | H02H 1/0015 382/168 |
| 2012/0197558 A1 * | 8/2012 | Henig | .................. | G01K 11/265 702/58 |
| 2016/0042904 A1 * | 2/2016 | Hou | .................. | H01H 85/0047 337/407 |
| 2016/0308345 A1 * | 10/2016 | Stoupis | ................. | H01H 85/20 |

* cited by examiner

*Primary Examiner* — Jacob R Crum
(74) *Attorney, Agent, or Firm* — Muncy, Geissler, Olds & Lowe, P.C.

(57) ABSTRACT

A smart, self-feeding fuse with current detection and communication capabilities for use in overhead medium voltage electrical distribution networks (15 kV to 34 kV). The device is configured to detect transient or permanent electric faults (sensor), and/or to be used as a communication device (gateway) that preserves the main protection function of the fuse element. The device is assembled on a base fuse and is simply installed by using a maneuver pole, similarly to the installation of a conventional fuse tube. The invention is self-fed by a high output current transformer with the help of photovoltaic cells, using a supercapacitor bank as the only power storage element.

13 Claims, 11 Drawing Sheets

SMART SELF-FEEDING FUSE WITH CURRENT DETECTION AND COMMUNICATION

FIELD OF THE INVENTION

The present invention relates generally to devices used in overhead electrical distribution systems. More specifically, the present invention relates to a smart fuse for electric grids.

BACKGROUND OF THE INVENTION

The present invention is directed to a smart, self-feeding fuse with current detection and communication capabilities. Depending on the way in which the inner components are assembled, the device can be used as a Fault Sensor, hereinafter referred to as a "SENSOR", and/or as a Communication Gateway, hereinafter referred to as a "GATEWAY". The device will be used in overhead electrical distribution grids to assist in detecting permanent or transient faults. A fault is a short circuit occurrence in the electrical network that can generate either a transient event, where there is no disconnection of the electrical distribution network, or a permanent event, where the electrical power supply is interrupted. The present invention is part of the "Internet of the Things" (IoT) network, and can be used for improving the control and protection of overhead electrical distribution networks.

Since the solution presented has two functions, SENSOR and GATEWAY, and these functions are currently performed by completely different equipment, the state of the art will be described in two parts.

The state of the art related to the identification and localization of faults is represented by fault detectors (a function also performed by the invention in the SENSOR configuration). The function of the fault detectors is to indicate the spot at which the circuit has been interrupted. To do so, they analyze the current levels of the circuit, and when there is a sudden variation in the current they enter into a signaling state indicated by a blinking LED which is usually red in colour. The fault detector has two signaling states. In the case of a transient fault, the detectors blink at one frequency, and in the case of a permanent fault, they blink at a higher frequency.

The large-scale application of said technology can provide the electrical system with great advantages. However, there are a number of restrictions that prevent this technology from widespread adoption, from the high cost of the current solutions to technical and operational issues that will be discussed below.

(a) The power feeding/supply system: In general, there are two types of feeding for the state of the art fault detectors. The simplest, cheapest sensors are powered by non-rechargeable batteries since they do not have an independent feeding means. This limits their use in several respects. In addition to generating significant maintenance and management costs, which is an issue when they are to be used on a large scale, the battery feeding has the drawback of limiting the detector operation time whenever a fault occurs in order to minimize the wear on each occurrence. Moreover, this drawback limits the use of fault detectors as active points in communication networks for use in tele-supervised systems.

(b) The second type of feeding, represented by more expensive and complex fault detectors, contains current transformers (CTs) having a split core that converts the current that flows in the overhead electrical distribution grid into energy for its own operation. In addition to their natural complexity, the fact that the CTs have split cores result in a high cost industrial product and exhibits an ampere/coil output much lower than closed core CTs due to the losses generated by the junction of the ferrous cores. As a result, said products require high currents in the primary network to operate correctly. It can be assumed that an average of 10 A to 15 A is required in the primary networks in order to ensure operation of the split core.

(c) Use of low output CTs: Existing solutions use a product format that requires the use of ferromagnetic CTs with open or split cores, which reduces the power output. The formats vary from simple solutions involving springs that enable them fault detectors to be installed by maneuver poles, to more complex solutions that require live line crews with trucks and aerial baskets for their installation.

(d) Periodic maintenance and low reliability: To ensure the reliability of the battery sensors, it is necessary to adopt a periodic and well-controlled intensive maintenance program since all solutions depend on the perfect working condition of the battery. Thus, the local battery check routines using magnetized devices installed in maneuver poles are indispensable in order to maintain the reliability of the system. Associated with this is the cost of replacing the batteries. However, even when a periodic maintenance routine is used, the reliability of the current solutions is low since the batteries could exhibit fatigue within hours or even minutes after an inspection is carried out, especially in the most conventional cases where the detectors are not tele-supervised.

(e) Limited use in tele-supervised systems: Most of the currently available solutions use low power radios integrated into the fault detectors that send periodic information to communication devices located within meters of the detector assembly. Said devices can be fed by a secondary electric power network, when present, or by solar panel systems and batteries that are integrated into the cellular communication system. Said configuration reduces their use in tele-supervised systems for a number of reasons. In urban networks, communication between the wire sensors and the communication devices occurs only when a fault takes place to prevent premature battery wear. Thus, important information about the electric loading of the power distribution network that could be used for planning or even for system overload preventive alarms is not sent to control centers. In rural networks, the dependence on public cellular network signals reduces its operating area to regions that have adequate communication coverage, which is not the case in most rural networks.

(f) Finally, existing alternatives that use split core CTs are complex solutions with a high final cost, thus making their large-scale use impractical.

The state of the art related to communication devices (a function performed by the invention in the GATEWAY configuration) is accomplished by different technologies, each of which has limitations and difficulties that have been addressed by the invention described herein. Traditional communication technologies that are based on short or even long-range radio are extremely complex to use in rural areas with small urban centers spread over large geographic areas. It is neither economical nor technically viable to create long-range radio links to cover towns having 20, 30 or up to 300 residences, with respect to the implementation of solutions relating to the automation, supervision and remote measurement of electrical power that are distributed along medium voltage grid. Said overhead energy grid can be over 100 km long, thus making it quite difficult to identify fault points, and this can be a challenge for any remote power management technology.

Another alternative is to use current PLC (Power Line Communication) technologies that can hopefully satisfy the needs of this scenario. However, when existing technologies were used in experiments on national electric power grids, they exhibited flaws that made their large-scale implementation impractical. Three distinct technology aspects are typically tested: 1) ultra-low speed technology that does not require couplers to transpose low voltage transformers, natural high frequency filters; 2) low speed technology that is mostly implemented in low voltage networks as a communication means among residential control equipment (residential automation) or even smart meters; and 3) broadband technologies that require couplers to overcome the barriers represented by the transformers and that are used as to provide data communication services over other technologies such as optical wires or radio.

The narrow band ultra-low speed communication solutions, typically represented by the "Turtle" technology manufactured by Schlumberger, are an excellent alternative to the transmission of metering data in rural networks, since the low voltage transformers do not require couplers and they can be transmitted for long distances, reaching more than 100 km without requiring repeaters. To this end, the frequency band in the transmission is extremely low, and ranges from 5 kHz to 15 kHz. Within said band, the "Turtle" technology limits each connection point to only 0.0015 Hz, thus allowing thousands of devices to share the same medium (split by the transmission frequency) and the signal can travel directly for long distances, consuming only 3.0 mW of power.

Despite all these advantages, the use of the "Turtle" technology is limited in the field of energy grid automation and supervision because the information takes up to days to be transmitted, thus preventing tele-command actions. The same occurs where clients require more constant measurements, as in the case of analyzing the load profile, remote cut and reclosing actions, or even information on faults and power restoration. The ultra-low speed therefore prevents said technology from expanding to other smart network applications, thus eliminating it as an option to be used in smart grids networks.

Within the group of PLC communication technologies, the "PRIME" (PoweRline Intelligent Metering Evolution) technology is currently predominant. This technology is represented by an alliance of manufacturers that currently encompasses the largest electric power metering companies, presenting itself as a major trend in the European market. According to "Alliance Forum", more than 10 million meters distributed by several manufacturers were installed in 2015, thus demonstrating a strong tendency to adopt this communication standard for AMR (Automatic Meter Reading) solutions. The "PRIME" technology operates through OFDM (Orthogonal Frequency-Division Multiplexing) modulation, thus ensuring a higher immunity to the noises present in the electric network. It has a star architecture, where communication concentrators are installed in the secondary low voltage transformers responsible for the communication between the meters, which are equipped with PLC-PRIME modems. Such technology is highly appropriate for underground networks because of its constructive characteristics. However, it does not address applications in rural electric networks, since it requires the availability of communication links between the metering concentrators and the management center, which are often nonexistent. Moreover, some tests using said technology have been conducted in Brazil, and most of them have demonstrated that communication using said low voltage technology was not efficient in view of the precarious characteristics of the Brazilian electric energy power distribution networks.

The third group uses BPLC (Broadband Power Line Carrier) technologies that represent an application more focused on rendering Internet Broadband services. In this application there are two architectures that can be used. In one architecture, medium voltage networks are used as a communication means between concentrators installed in a secondary low voltage network, and optical/radio microwave networks installed in substations. This is the most suitable architecture to satisfy application needs in rural networks. The other architecture conforms to the same standard as that of the "PRIME" technology. However, this technology suffers from the same interference problems in low voltage networks exhibited by the "PRIME" technology, with which it shares the modulation form, and requires couplers with the same transformer isolation to transpose the high frequency filters represented by the distribution transformers.

In addition to all of the above limitations, the use of PLC technology is impractical when solving problems in automation and monitoring electric networks, simply because the physical communication means is the electric wire itself. Once broken, the information will no longer be available, a fact that definitively prevents its use as an alternative to automation and supervision equipment for electric power distribution networks.

Thus, the state of the art does not represent a solution to the communication problems present in power distributors to serve the rural population and the population in urban areas.

SUMMARY OF THE INVENTION

The present invention is directed to a smart, self-feeding fuse for electrical grids that is quickly and easily installed and that has two configurations with complementary functions: 1) current detection by discriminating the rated currents from the currents generated by permanent or transient faults (SENSOR), and 2) long-range communication when in the long-range radio function (GATEWAY).

The SENSOR operates similarly to traditional fault detectors, sending information related to transient or permanent faults to a control center by means of its own communication network.

The GATEWAY combines two of the best communication technologies: the radio frequency communication technology, MESH, which is based on data pack routing at each node of the data network, with the Point-to-Multipoint radio frequency communication technology, which is based on the creation of sectored star networks. Each of said technologies is used as part of the solution, making it possible to create communication networks that can be used in solutions related to the automation of overhead electrical distribution grids, as well as the automation of electronic meters in urban and/or isolated regions, where there are no viable ways to access traditional communication networks, or where the present solutions are expensive, thus making it impossible to design remote metering.

The device is installed in a medium voltage energy grid (15 kV, 27 kV and 34 kV voltages) assembled on Matheus Type C base fuse, maintaining the protection characteristic of the fuse element. The device is assembled around the fuse tube, leaving the fuse element unchanged. The device can perform the SENSOR and/or GATEWAY functions, depending on its inner configuration.

The device uses the induction of the load currents of the medium voltage energy grid for its supply, as well as its physical structure, such as its mechanical support, to create a communication cell (GATEWAY) and/or a current detector (SENSOR).

The SENSOR is associated with each of the phases of the overhead electrical distribution grid (Phases A, B and C), monitoring the operation conditions thereof. Several sets of SENSORs will be associated with a certain GATEWAY using a short-range radio STAR architecture (Point-to-Multipoint). The GATEWAY contains a hybrid communication architecture, STAR-MESH. Among several GATEWAY devices, there will be a MESH communication network with a transport protocol implemented by a 6LowPAN (IPv6 over Low-Power Wireless Personal Area Networks) network, or another one similar thereto, wherein each element will represent a reinforcement node for the next element. Thus, the communication network will extend along the cables of the electrical power distribution networks in such a way that the communication is viable along the overhead electrical distribution grid. The communication in this layer can be implemented in a free frequency, in the 433 MHz or 900 MHz band for example, or in a licensed frequency such as the 400 MHz band.

In addition to the MESH network, the GATEWAY device provides another radio frequency communication means, in a Point-to-Multipoint architecture implemented by a network as per the LoRa standard (Low Power Wide Area Networks), LoRa Alliance, or the like, thus creating a local communication island that will allow the association of several devices on the IoT network. The GATEWAY device will be able to operate as an end device or a repeater, making it possible to extend the communication for long stretches without the need to create auxiliary communication networks. Thus, we will have a main communication network formed by the radio frequency communication MESH/6LowPAN, or the like, and secondary networks formed by small communication islands next to the devices to be integrated, formed by radio frequency networks Point-to-Multipoint/LoRa, or the like.

The topology of these networks will be a combination of STAR networks (next to radio frequency devices), with repeater radial networks using RF-MESH communication technology supported by overhead medium voltage electrical distribution grids.

At each node of this communication network, which consists of a GATEWAY device, several SENSOR devices that perform the current detection function in electric power networks will be associated thereto, allowing the control centers to monitor the functioning of the electric networks remotely, thus facilitating the identification of interruption points in the overhead electrical distribution grid and the monitoring of the load currents.

DETAILED DESCRIPTION OF THE INVENTION

The present invention exerts two distinct and inherently associated functions. In the SENSOR configuration, it performs the basic functions of identifying transient and permanent faults, differential signaling using a blinking LED, configuration of transient settings, monitoring the load current of the circuit in RMS values, and sending fault events and the geophysical localization thereof by GPS. The present invention also has an accelerometer that can identify when the fuse element with which it is associated is burned out, and when it has been removed from its place of origin by the identification of movement.

To provide a fault detection solution, the present solution associates the devices in the SENSOR configuration to the devices in the GATEWAY configuration that are installed in phase B of the circuit, which is responsible for the management and communication of the devices in the SENSOR configuration. As many SENSORS as required for monitoring the neighboring circuits can be associated with the devices in the GATEWAY function, thus optimizing the costs of fault detection in separate circuit branches. The use of the LoRa (Low Power Wide Area Networks) technology for communication between GATEWAYS and SENSORS enables each GATEWAY to cover an area of 5 $km^2$ to 10 $km^2$, thus optimizing the costs and complexity of installing supervision solutions in large geographic areas.

The SENSOR has the following constructive characteristics: it has a microprocessor with a CT input for current reading, self-feeding by a nanocrystalline core CT, a set of supercapacitors capable of sending fault information upon power interruption, an LED for identifying the fault, and a RF-LoRa radio with an inner antenna to communicate with the GATEWAY devices. The SENSOR's mechanical construction is designed to be installable by a maneuver pole directly onto Matheus Type C base fuse tubes, thus keeping the fuse element's protection function intact. The device is installed without disconnecting the energy power grid using a short circuit spring, which has already been developed for this purpose.

The GATEWAY is designed to combine the best of two communication technologies. First, it overcomes the long distances required to reach small towns by using the RF/MESH technology at free frequencies such as 433 MHz and 900 MHz, or licensed frequencies such as 400 MHz, so that the signals travel over long distances at rates up to 300 Kbps. Second, it uses the RF/Point-to-Multipoint at free frequencies within the 433 MHz or 900 MHz bands as a transportation means for the communication devices associated with low voltage energy grids, avoiding the interference problems present in the Brazilian energy grid. That is, the medium voltage grid will support the main RF/MESH communication branch, while the low voltage grid, to which the equipment to be integrated will be connected, is served by the RF/Point-to-MultiPoint technology, providing communication with SENSOR devices and, eventually, with other devices that will be compatible with the existing communication network.

In the GATEWAY configuration, the invention is represented by a 6LowPAN (IPv6 over Low power Wireless Personal Area Networks) protocol converter for LoRA (IPv6 over Low power Wireless Personal Area Networks-Low Power Wide Area Networks). Alternatively, it can use other protocols that are created to exhibit the same communication topology. The device is installed at phase B of the overhead energy power distribution grid, directly onto the Matheus Type C base fuse, maintaining the basic protection function of the fuse and adding two other functionalities: one of short-range communication carried out by a radio operating in the STAR topology at free frequencies in the 433 MHz or 900 MHz bands, to be used in the final connecting points in the so-called "last mile network", and the other of long-range communication carried out by a radio operating in the MESH topology at free frequencies in the 433 MHz or 900 MHz bands, or a licensed frequency in the 400 MHz band, thus establishing a direct connection to the WAN (Wide Area Network) where available, for example, in electric power substations, stores, or other points made available by telecommunication operators. The GATEWAY also plays the role of a signal repeater, allowing RF/MESH networks to travel long distances, which is one of the main goals of this invention.

The use of Matheus Type C base fuses as a physical support and power supply feeding means for GATEWAY represents one of the innovations of the solution. By definition, energy grids are radial networks located close to the communication points to be integrated with sensing and metering solutions, and there are thousands of fuse elements supported by Matheus Type C bases. Thus, the physical proximity makes the communication more efficient, allowing the direction of the radiated power along the energy grid path. On the other hand, in places where the communication signals need to be broadly radiated so that several devices are associated to the communication network, a highly sensitive LoRa standard STAR network will be used, thus facilitating the association of several points, even if they are installed under adverse conditions. The use of the medium voltage energy grids for feeding power and Matheus Type C base fuses for physically supporting the GATEWAY are also elements for facilitating and reducing costs, and they are only possible due to the association with other technologies such as the use of supercapacitors (without batteries) to maintain the power supply when the load current of the circuit is absent, as well as the use of OPV (Organic Photo Voltaic) standard solar cells as an aid in the generation of power at times of low main circuit loading.

The GATEWAY operates as a transport for different communication protocols, comprising only up to layer 4 of the OSI (Open System Interconnection) model (the Transport layer), allowing several applications to use the same communication medium. It uses 6LowPAN as the transport protocol, encapsulating different application protocols according to this standard. This makes it possible to conform the solution to network standards worldwide, facilitating its integration with existing communication networks.

The GATEWAY performs the 6LowPAN/LoRa protocol conversion by providing transportation of the equipment data used in the detection of the power supply distribution networks, such as fault signalers (SENSOR) and other network elements, as well as the remote reading of smart electric power meters and the gateways thereof, for the purpose of billing and management. To this end, the GATEWAY has technology that can differentiate data packets according to their priority, allowing the information from DA (Distribution Automation) to be transported in priority over remote metering information—AMR (Automatic Meter Reading).

From a constructive aspect, GATEWAY is designed to be installed directly onto Matheus Type C base fuses without requiring any adaptation. To that end, it is provided with the innovative technologies described herein, satisfying the premise of easy installation and low cost that is essential for its large-scale use.

From the exclusive communication network aspect, the 6LowPAN-LoRa GATEWAYS are devices that play the role of the so-called "Range Extender" network elements of simple and cheap configuration that are responsible for the extension of communication networks to more distant points by repeating signals. This is one of the roles of GATEWAY, and it should not be viewed as a data concentration or processing element.

The above descriptions do not limit the use of GATEWAY to the "Internet of Things" communication application. The way it is installed and fixed, as well as its self-feeding capabilities by high output nanocrystalline current transformers and its association with OPV photovoltaic cells for additional support in power generation, are technical elements that can be used to support other communication technologies such as those foreseen in future 5G communication networks represented by the so-called communication "femtocells". The GATEWAY proposed herein, similarly to its application in monitoring electric power distribution networks, could also be used in high voltage transmission lines.

The characteristics of the invention are described below:

1) In the SENSOR configuration: The invention allows the differentiation of transient faults generated by short circuits and transient faults generated by "inrush" currents, and enables the constant sending of RMS currents of all associated phases to the GATEWAY in addition to local signaling (LED) and remote signaling of transient events.

2) In the GATEWAY configuration: The device is different from existing devices in that it links two different technologies, 6LowPAN and LoRa, which each play a distinct role in the solution. The 6LowPAN technology serves to support long-range communication operating over medium voltage networks, since they are closer to the points to be integrated into the communication network, serving as the ideal physical support means for data communication devices through the use of Matheus Type C base fuses, and for supplying the energy of the GATEWAY. The LoRa technology, serving as a communication means for "last mile" networks, prevents the high electrical interference problems found in low voltage networks as a result of the precariousness of the electrical installations present in the national electric networks, thus creating broad spectrum and long-range communication cells that allow for the integration of several devices.

3) Product installation and format: The present invention (in both the SENSOR configuration and the GATEWAY configuration) is based on the use of closed core nanocrystalline fuse CTs that are directly installed on Matheus Type C base fuses in such a way that they can be installed and removed quickly and easily. With the short circuit spring present, as well as the equipment of electrician crews, it can be installed or removed without interrupting the feeding circuit and without using trucks or aerial baskets. The installation is carried out by the maneuver pole directly on the ground, similar to the installation of a conventional fuse tube.

4) Self-feeding system using a high output nanocrystalline CT: the construction of the nanocrystalline CT associated with the fuse element allows for the use of a closed core CT with a high ampere/coil output, resulting in a higher power generation capacity from the current present in the primary medium voltage network, thus making it possible to exert functions that require a higher consumption of power. The auto-feeding element also dispenses with low voltage networks and the need for grounding, thus making the device immune to faults generated by atmospheric discharges usually present in both rural and urban areas.

5) Absence of batteries and electrolytic capacitors: The invention replaces traditional batteries with supercapacitors that are dimensioned so that maintenance is not required. The supercapacitors have low leakage currents and a lifespan longer than 30 years. Electronic circuits do not use electrolytic capacitors since they are largely responsible for the low reliability of electronic systems and they exhibit a high fatigue curve as a function of the high operating temperatures that are incompatible with the life expectancy and reliability of the invention.

6) Use of standard OPV (Organic Photo Voltaic) photovoltaic cells: The invention uses OPV photovoltaic cells integrated into the body of the product that are used as an auxiliary electric power source when the primary medium voltage power circuits are interrupted, allowing communication to be maintained for a certain period at critical times of electric power interruption.

The accompanying Figures will now be described in more detail.

Figure 1:
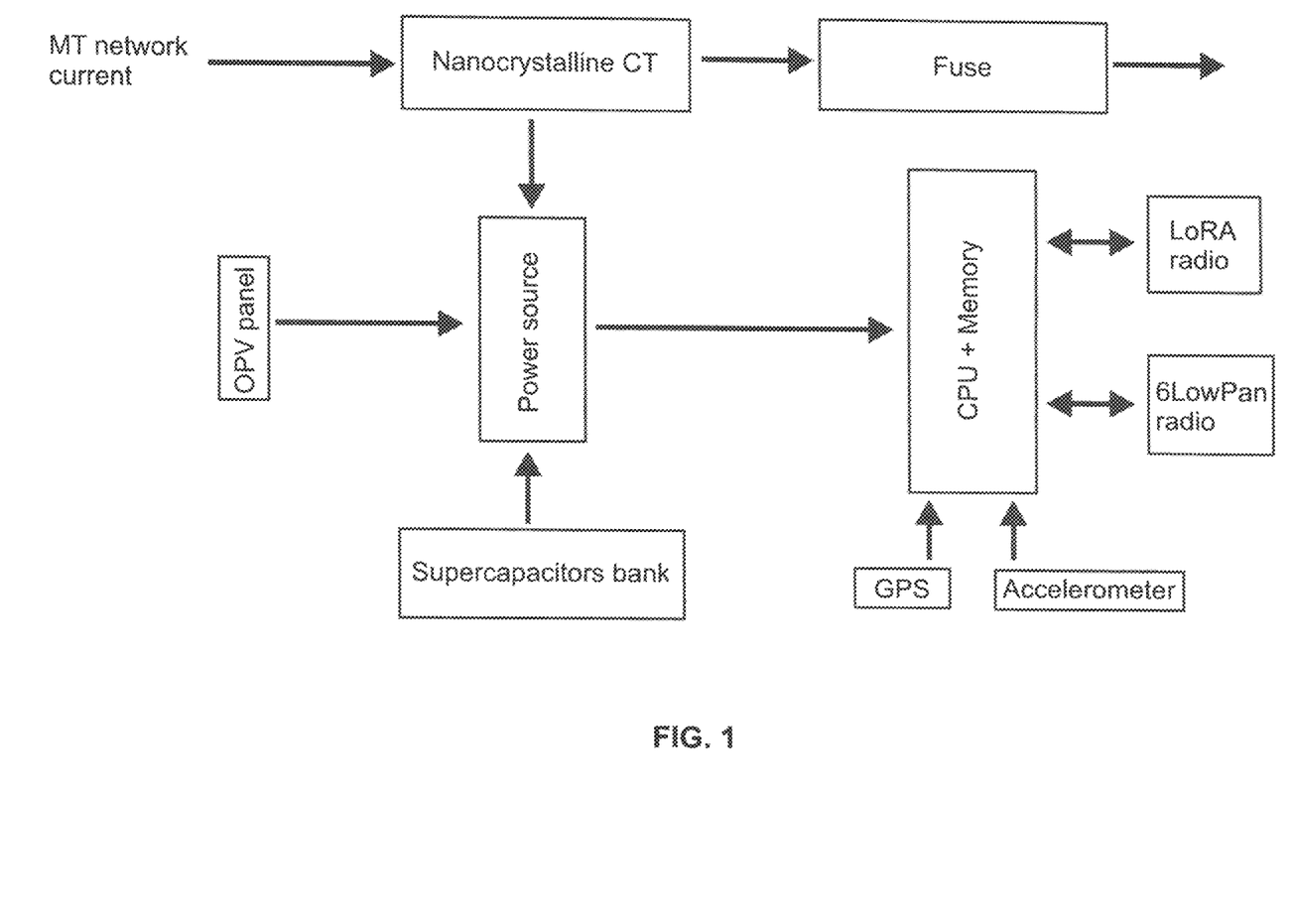
FIG. 1 is a block diagram showing the main components of the self-feeding fuse assembled as a GATEWAY.

FIG. 1 depicts a block diagram of the present invention assembled as a GATEWAY, showing the main components thereof. The GATEWAY has a self-feeding system comprised of a nanocrystalline core current transformer to supply the main power, which is obtained from the current in the medium voltage network; a fuse, whose basic functions remain intact; a power source; a supercapacitors bank to support the feeding in the absence of electric current in the primary network; a photovoltaic film, OPV panel for supplying auxiliary power when the load in the primary electric network is low; two communication blocks, LoRa radio and 6LowPAN radio, to form the MESH and Point-to-Multipoint networks; a GPS module to identify the georeferenced coordinates of the device; an accelerometer module to identify the fall of the fuse tube or its removal from the installation site; and a CPU with memory.

Figure 2:
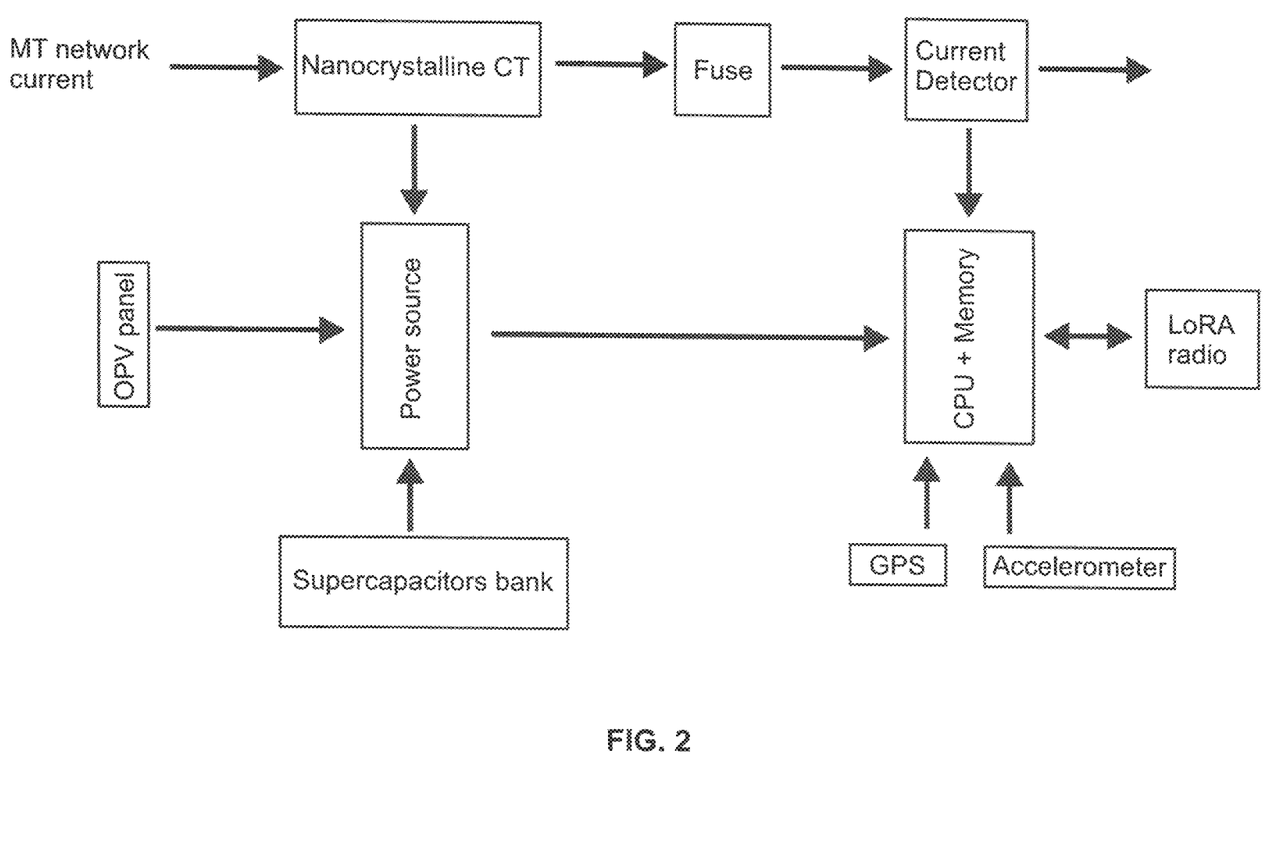
FIG. 2 is a block diagram showing the main components of the self-feeding fuse assembled as a SENSOR.

FIG. 2 depicts a block diagram of the present invention assembled as a SENSOR, showing the main components thereof. The SENSOR has a self-feeding system comprised of a nanocrystalline core current transformer to supply the main power, which is obtained from the current in the medium voltage network; a fuse element, whose basic functions remain intact; a current detector to detect the current of the primary network; a power source; a supercapacitors bank to support the feeding in the absence of electric current in the primary network; a photovoltaic film, OPV panel for supplying auxiliary power when the load in the electric network is low; a CPU board with a memory; a Point-to-MultiPoint LoRa radio; a GPS module to identify the georeferenced coordinates of the device; and an accelerometer module to identify the fall of the fuse tube or its removal from the installation site.

Figure 3:
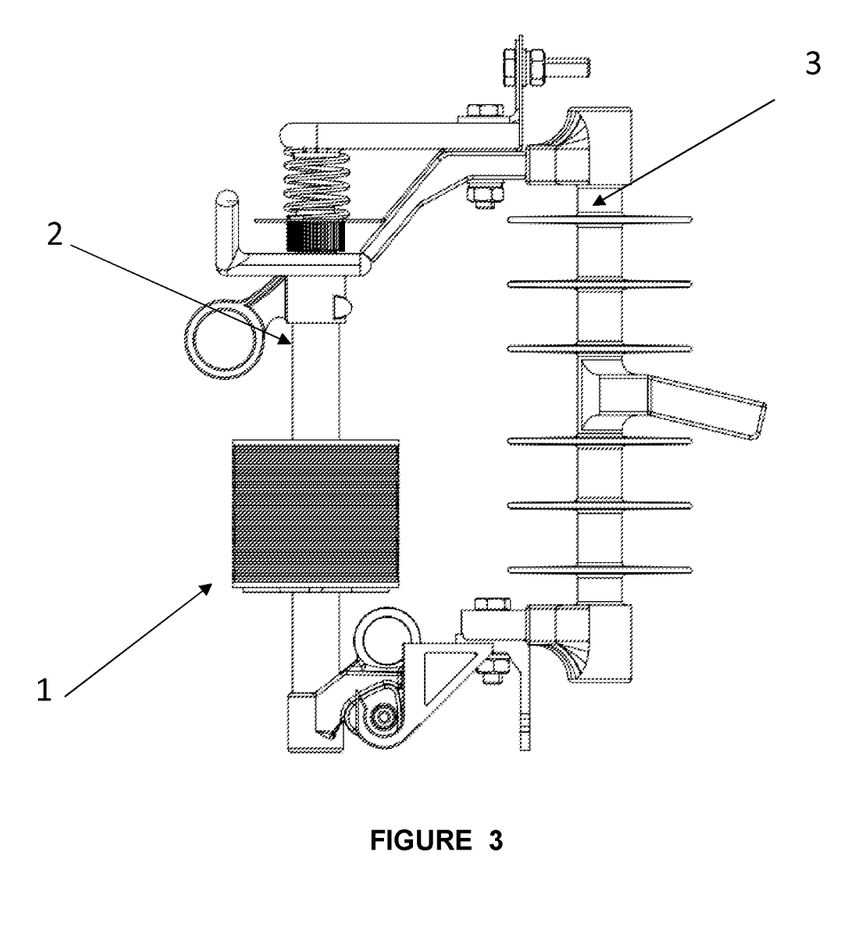
FIG. 3 is a 3D view of the GATEWAY installed on a Matheus Type C base fuse.

The following FIGS. 3 to 10 describe the device in detail. However, the proportions therein are mere references, and can be changed in order to fully satisfy the requirements of the invention:

FIG. 3 represents a 3D view of the invention in the GATEWAY configuration. The GATEWAY (1) is installed on a Matheus Type C base fuse support (3), integral with the conventional fuse tube (2) to preserve the original protection function of the fuse element.

Figure 4:
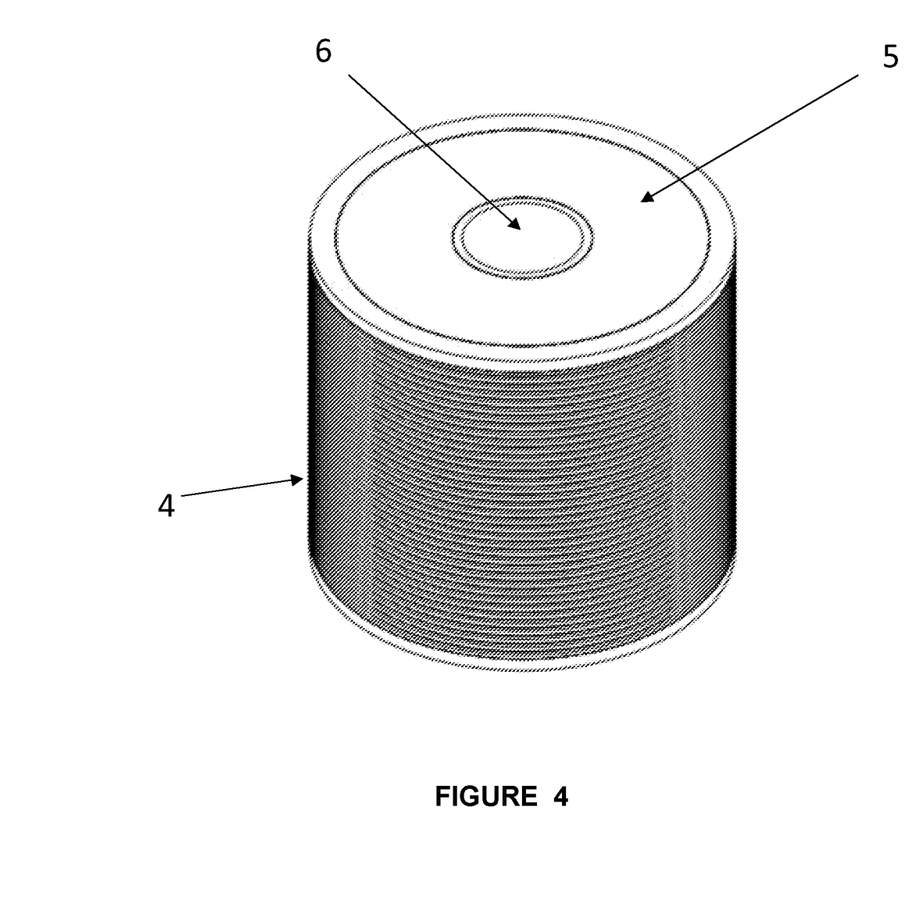
FIG. 4 is a perspective view of the GATEWAY.

FIG. 4 represents a 3D view of the invention in the GATEWAY configuration, showing the OPV solar capture film (4), the isolating epoxy resin (5) that makes the device impervious to liquids and protects the electronic components therein from humidity and corrosion, and the through-hole (6) through which the conventional fuse tube is inserted, making it possible to preserve the original protective function of the fuse element.

Figure 5:
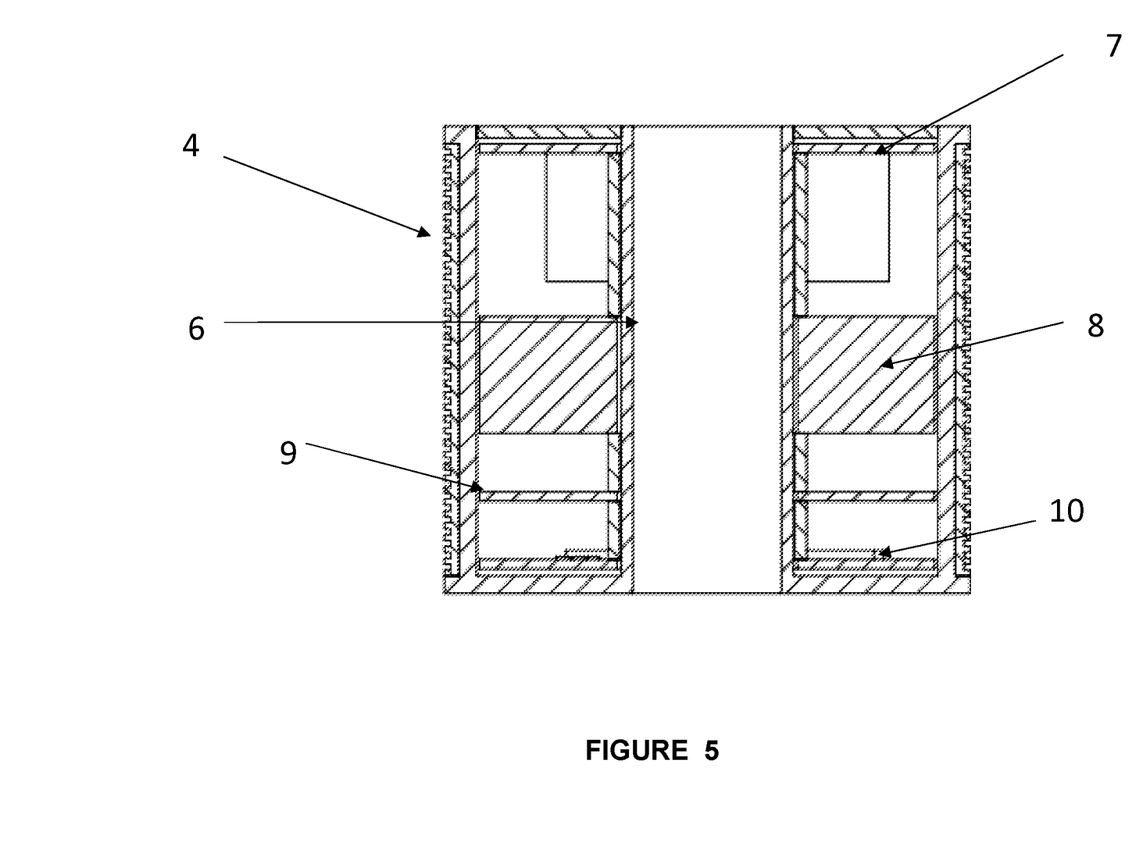
FIG. 5 is a cross-sectional view of the GATEWAY.

FIG. 5 represents a cross-sectional view of the invention assembled in the GATEWAY configuration, showing the OPV photovoltaic film (4), the through-hole (6), the supercapacitors board (7) for maintaining the operation of the invention in the absence of current in the primary electric power network, the nanocrystalline core CT to provide self-feeding (8), the PCI (Peripheral Component Interconnect) containing a short range (LoRa) radio and a long range (MESH) radio (9), with their respective antennas, and a main PCI board (10) containing the CPU with memory, a GPS module and an accelerometer module.

Figure 6:
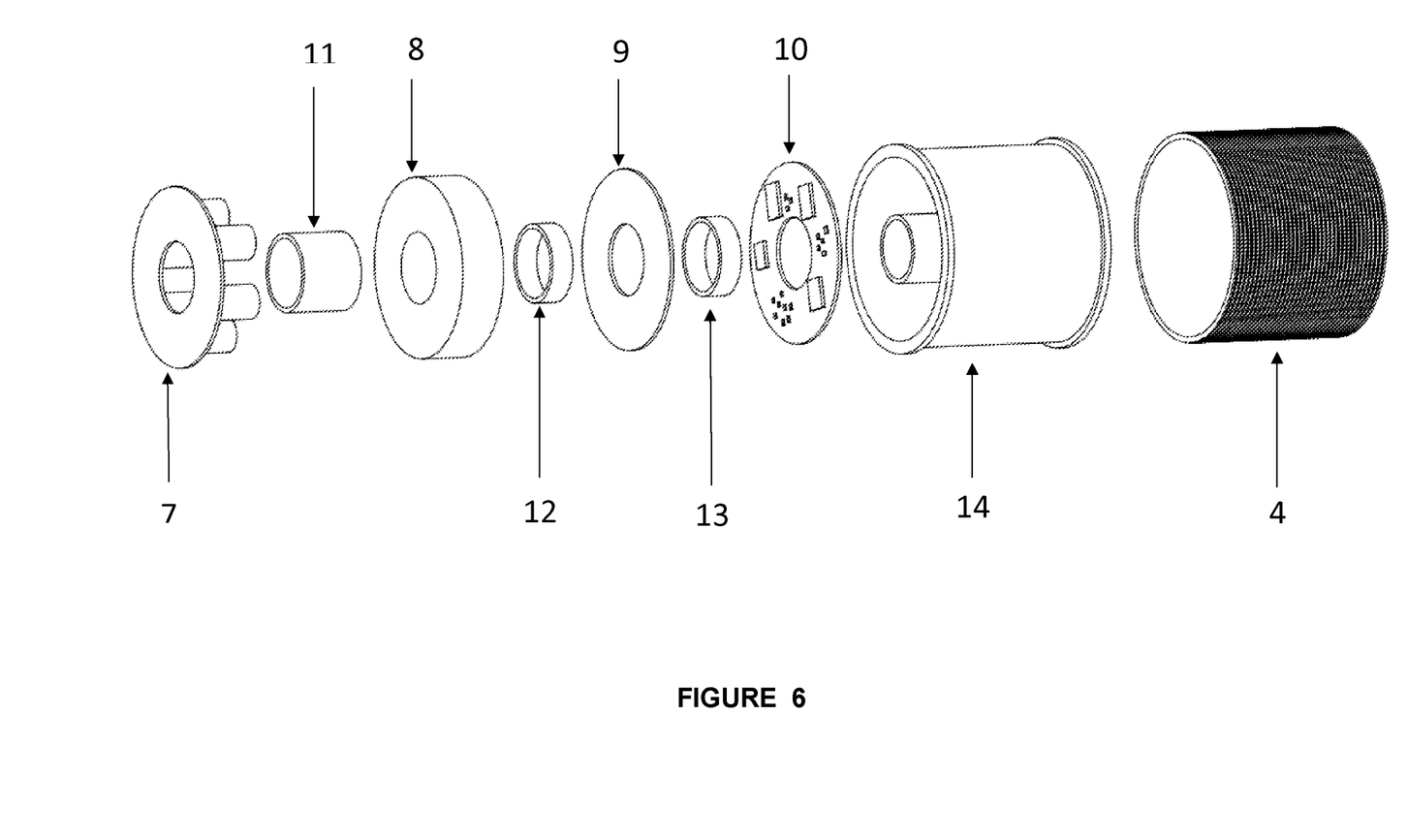
FIG. 6 is an exploded view of the GATEWAY.

FIG. 6 represents an exploded view of the invention assembled in the GATEWAY configuration, showing all its components and respective assemblies. FIG. 6 shows the supercapacitors board (7), the assembling ring 1 (11), the self-feeding nanocrystalline CT (8), the communication PCI with the radios (9), the assembling ring 2 (12), the main PCI board (10), the assembling ring 3 (13), the GATEWAY plastic cabinet (14), and the OPV solar film (4).

Figure 7:
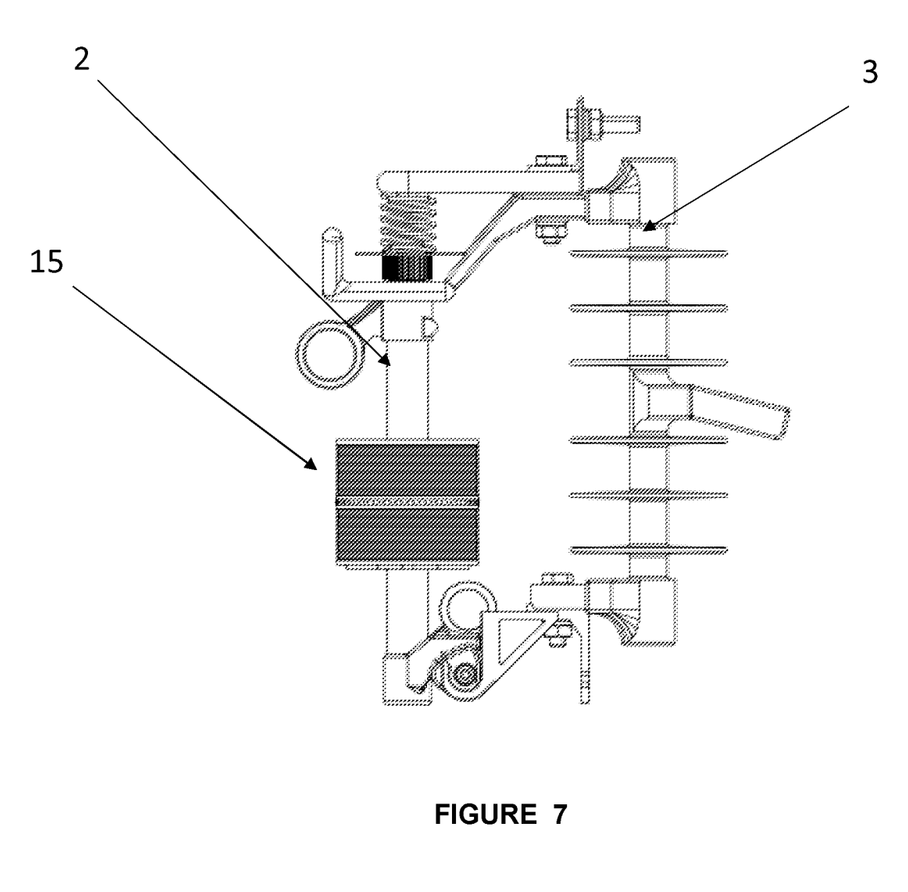
FIG. 7 is a 3D view of the SENSOR installed on a Matheus Type C base fuse.

FIG. 7 represents a 3D view of the invention assembled in the SENSOR configuration (15) installed on a Matheus Type C fuse (3), integral with the conventional fuse tube (2) to preserve the original protective function of the fuse element.

Figure 8:
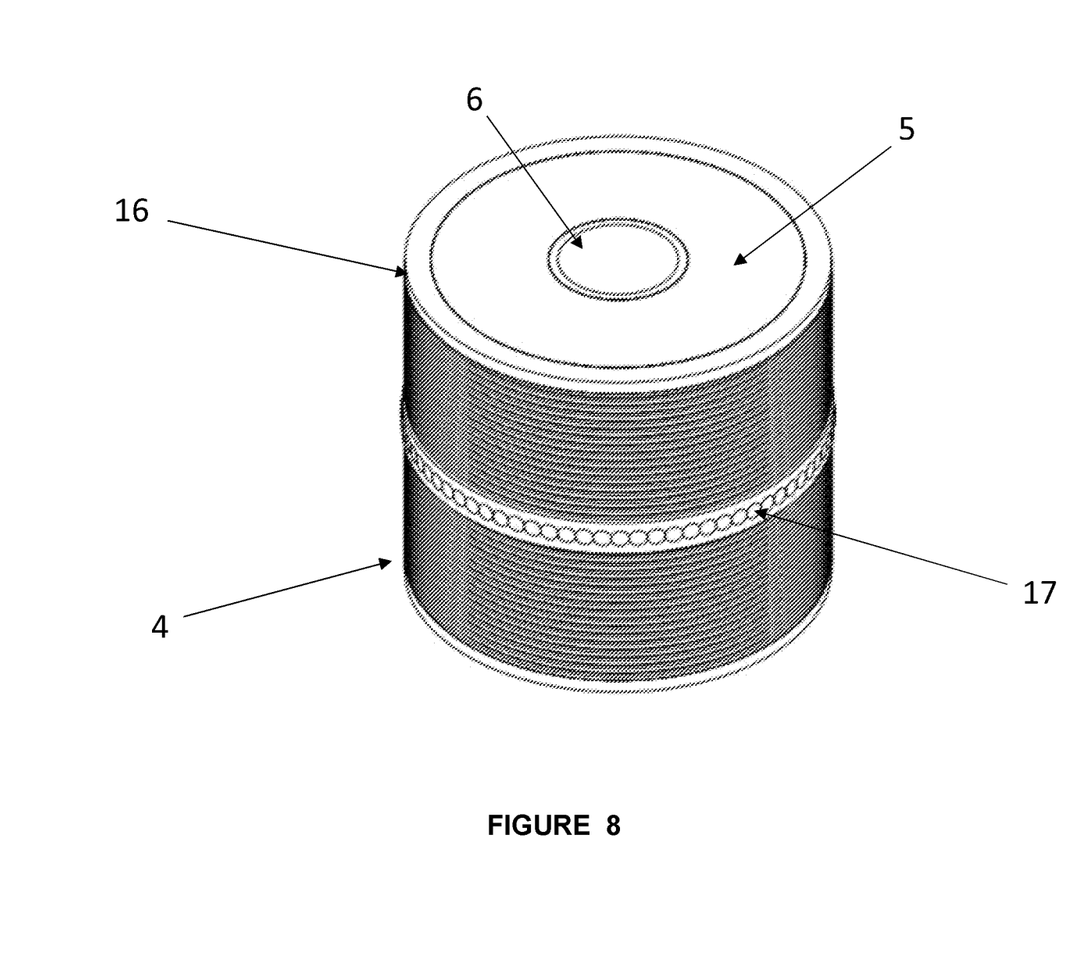
FIG. 8 is a perspective view of the SENSOR.

FIG. 8 represents a 3D view of the invention assembled in the SENSOR configuration, showing the OPV solar capture film (4), the isolating epoxy resin (5) that serves to make the device impervious to liquids and protects the electronic components therein from humidity and corrosion, the SENSOR plastic cabinet (16) and the through-hole (6) through which the conventional fuse tube is inserted, making it possible to preserve the original protective function of the fuse element.

Figure 9:
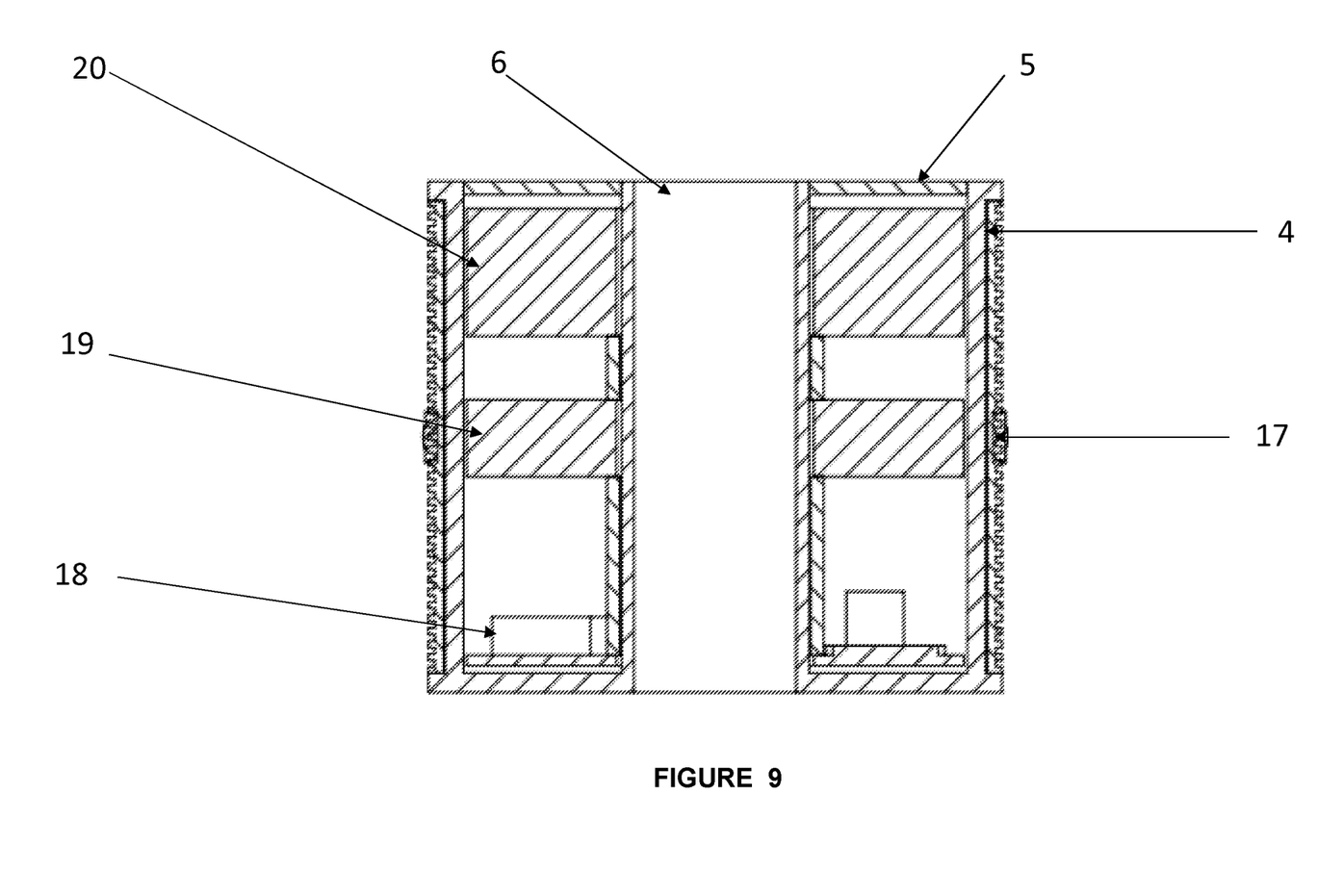
FIG. 9 is a cross-sectional view of the SENSOR.

FIG. 9 represents a cross-sectional view of the invention assembled in the SENSOR configuration, showing the OPV photovoltaic film (4), the isolating epoxy resin (5), the through-hole (6), the high intensity LED ribbon that will show the status of the SENSOR (17), the nanocrystalline core CT to provide self-feeding (20), the main PCI containing the short range radio (LoRa), with its respective antenna, the CPU, memory, GPS module and accelerometer module (18), and the CT of the current detector (19).

Figure 10:
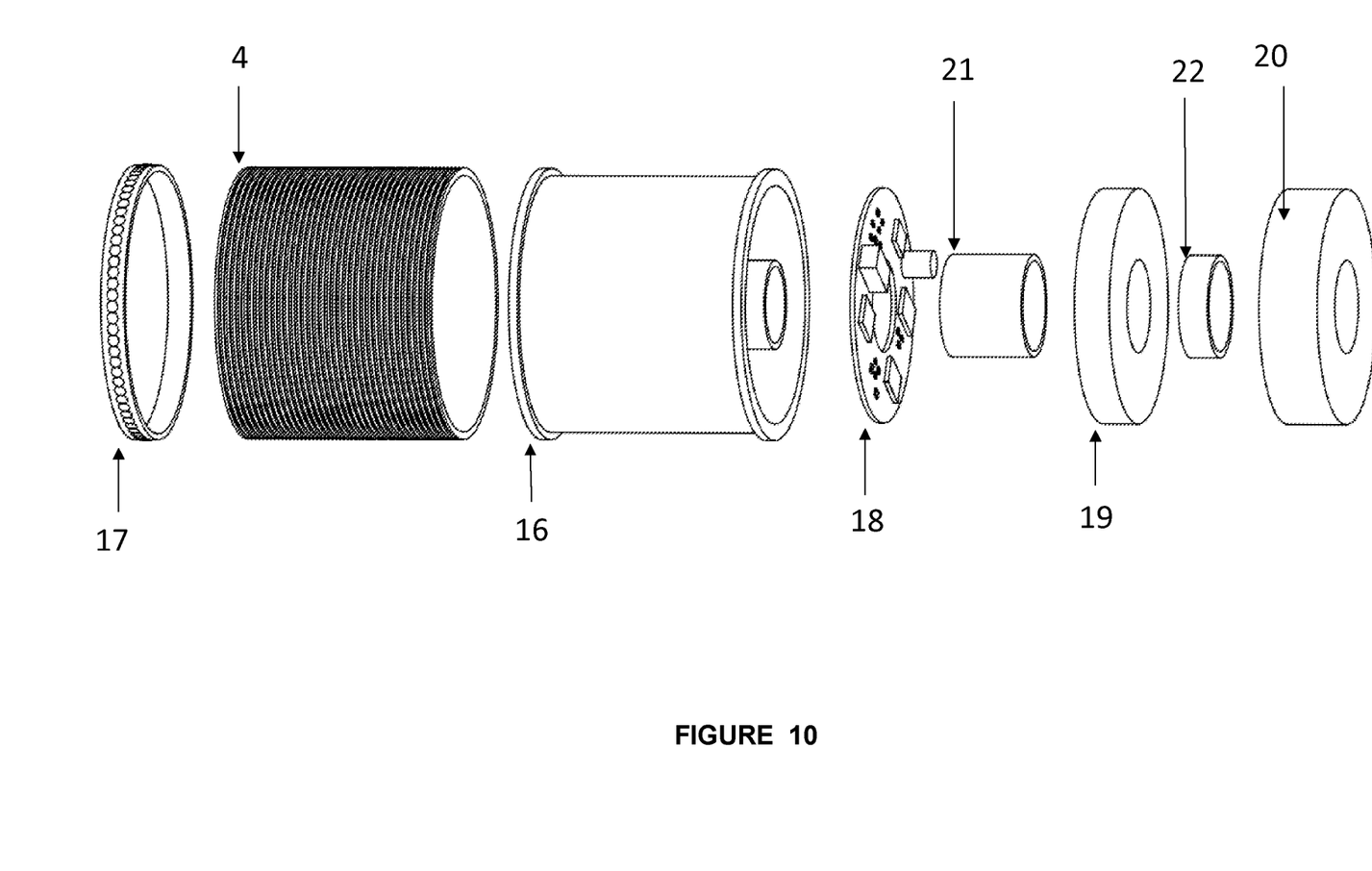
FIG. 10 is an exploded view of the SENSOR.

FIG. 10 represents an exploded view of the invention assembled in the SENSOR configuration, showing all its components and respective assemblies. FIG. 10 shows the OPV solar film (4), the high intensity LED ring (17), the SENSOR plastic cabinet (16), the main PCI board containing the radio, CPU, memory, GPS module and accelerometer module (18), the assembling ring 4 (21), the CT of the current detector (19), the assembling ring 5 (22), and the self-feeding nanocrystalline core CT (20).

Figure 11:
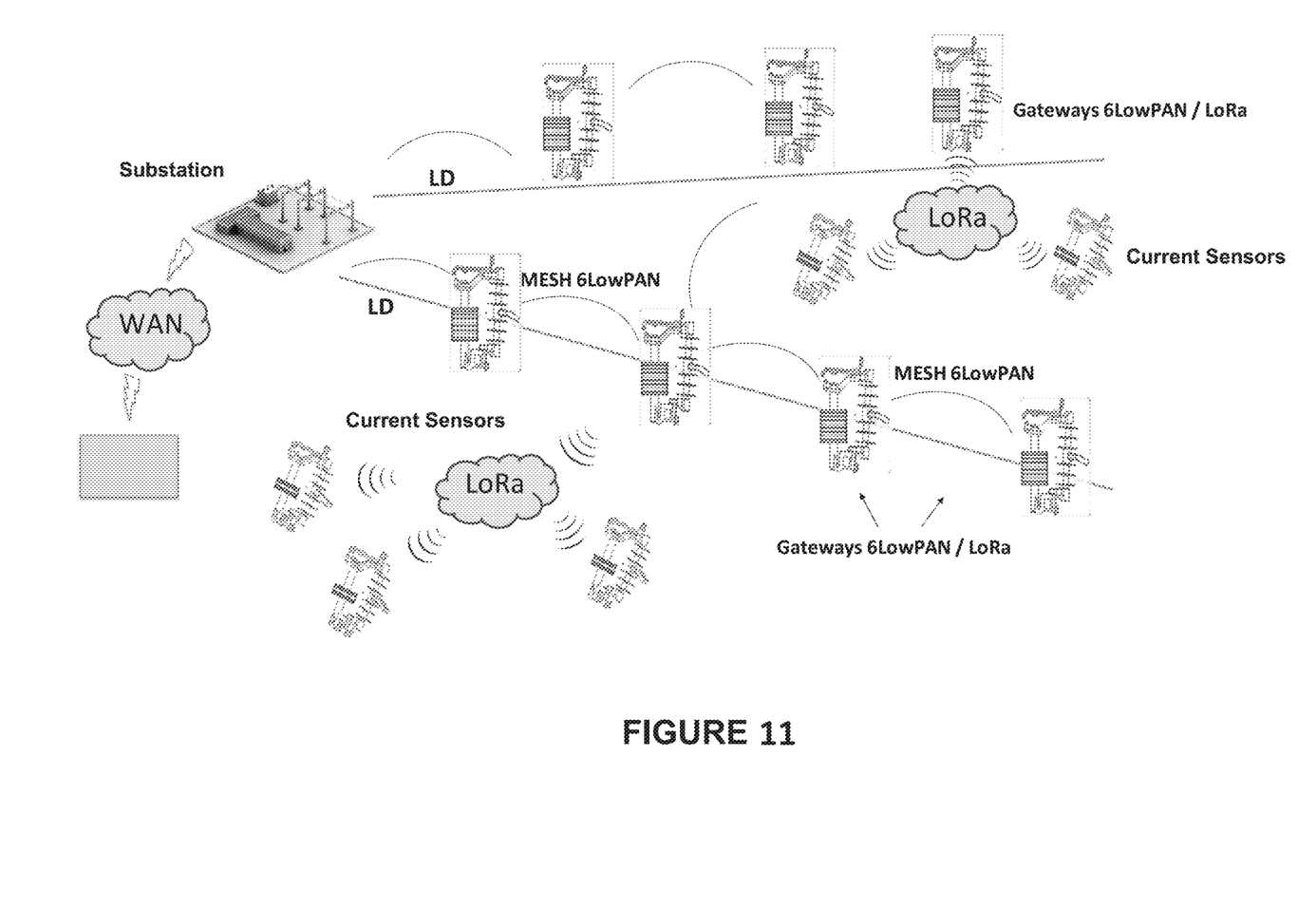
FIG. 11 shows the topology of the communication network comprised of self-feeding fuses in both the GATEWAY and SENSOR configurations.

FIG. 11 represents the topology of the GATEWAY and SENSOR communication network, exemplifying the flexibility of the installation arrangements that allow the communication of several devices within the IoT network using the communication technologies described herein. This figure shows the composition of the communication architecture formed by the invention in the GATEWAY configuration, which establishes networks that communicate with one another in the MESH topology while establishing communication networks in the STAR topology. Each GATEWAY "illuminates" a certain coverage area, thus allowing the communication of other automation elements and remote metering, such as the invention in the SENSOR configuration or electric power meters which are compatible with the transport protocols described herein.

The present invention is directed to a smart, self-feeding fuse with current detection and communication capabilities that is designed to be installed directly into a medium voltage electric power distribution network (15 kV to 34 kV) using Matheus Type C base fuses as a physical support, preserving the original protection function of the fuses and further including the functions of communicating and signaling transient or permanent faults.

The device may also be equipped with connectors for association with different radios for IoT technologies. Radios of other technologies can be housed in these same connectors, not limiting its use to the IoT network. Radios for the GPRS, 3G, 4G or 5G technologies, or future communication technologies that may become available, can be housed in this same GATEWAY since the object of the invention is to create a feeding device with different electronics housed therein, that are placed in electric conductors of aerial power supply distribution networks having the Matheus Type C base fuse as its element of physical attachment and electrical supply.

The invention claimed is:

1. A smart, self-feeding fuse comprising a device assembled in one of a sensor configuration or a gateway configuration, and physically supported by attachment to a Matheus Type C base fuse in an overhead medium voltage electrical distribution grid;
    wherein in the sensor configuration, the device detects currents, identifies transient and permanent faults, and sends information on the transient and permanent faults to a control center; and
    wherein in the gateway configuration, the device enables long-range communication; and
    wherein the device in the gateway configuration comprises:
        a LoRa radio; and
        a 6LowPAN radio; and
    wherein the LoRa radio and the 6LowPAN radio form a communication cloud along the overhead medium voltage electrical distribution grid.

2. The fuse according to claim 1, wherein the device in the sensor configuration comprises:
    a. a nanocrystalline core current transformer;
    b. a current detector;
    c. a power source;
    d. a supercapacitors bank;
    e. a photovoltaic film;
    f. a high intensity LED ribbon;
    g. a CPU board with memory;
    h. the LoRa radio;
    i. a GPS module; and
    j. an accelerometer module.

3. The fuse according to claim 2, wherein the supercapacitors bank is the only power storage means that maintains power supply in the absence of a current load in the overhead medium voltage electrical distribution grid.

4. The fuse according to claim 2, wherein the photovoltaic film is an OPV panel that supplies auxiliary power to the device when a current load in the overhead medium voltage electrical distribution grid is low.

5. The fuse according to claim 1, wherein the device in the sensor configuration differentiates between transient faults generated by short circuit currents and transient faults generated by inrush currents.

6. The fuse according to claim 1, wherein the device in the gateway configuration further comprises:
    a. a nanocrystalline core current transformer;
    b. a power source;
    c. a supercapacitors bank;
    d. a photovoltaic film;
    e. a CPU board with memory;
    f. a GPS module; and
    g. an accelerometer module.

7. The fuse according to claim 6, wherein the supercapacitors bank is the only power storage means that maintains power supply in the absence of a current load in the overhead medium voltage electrical distribution grid.

8. The fuse according to claim 6, wherein the photovoltaic film is an OPV panel that supplies auxiliary power to the device when a current load in the overhead medium voltage electrical distribution grid is low.

9. The fuse according to claim 6, wherein the communication cloud formed by the LoRa radio and the 6LowPAN radio enables communication within an Internet of Things network.

10. The fuse according to claim 1, wherein a transmission voltage in the overhead medium voltage electrical distribution grid is selected from the group consisting of 15 kV, 27 kV and 34 kV.

11. A communication network that comprises:
    a. devices in the sensor configuration according to claim 1; and
    b. devices in the gateway configuration according to claim 1;
    wherein the devices in the sensor configuration are associated with the devices in the gateway configuration to form a short-range communication network in a STAR architecture; and
    wherein the devices in the gateway configuration form a long-range MESH communication network.

12. A smart, self-feeding fuse comprising a device assembled in one of a sensor configuration or a gateway configuration, and physically supported by attachment to a Matheus Type C base fuse in an overhead medium voltage electrical distribution grid;
    wherein in the sensor configuration, the device detects currents, identifies transient and permanent faults, and sends information on the transient and permanent faults to a control center;
    wherein in the gateway configuration, the device enables long-range communication; and
    wherein the device in the sensor configuration comprises:
        a. a nanocrystalline core current transformer;
        b. a current detector;
        c. a power source;
        d. a supercapacitors bank;
        e. a photovoltaic film;
        f. a high intensity LED ribbon;
        g. a CPU board with memory;
        h. a LoRa radio;
        i. a GPS module; and
        j. an accelerometer module.

13. A smart, self-feeding fuse comprising a device assembled in one of a sensor configuration or a gateway configuration, and physically supported by attachment to a Matheus Type C base fuse in an overhead medium voltage electrical distribution grid;
- wherein in the sensor configuration, the device detects currents, identifies transient and permanent faults, and sends information on the transient and permanent faults to a control center;
- wherein in the gateway configuration, the device enables long-range communication; and
- wherein the device in the gateway configuration further comprises:
- a. a nanocrystalline core current transformer;
- b. a power source;
- c. a supercapacitors bank;
- d. a photovoltaic film;
- e. a CPU board with memory;
- f. a GPS module; and
- g. an accelerometer module.

* * * * *